(12) United States Patent
Wei et al.

(10) Patent No.: US 12,433,128 B2
(45) Date of Patent: Sep. 30, 2025

(54) CHIP WITH PADS OF DIFFERING WIDTH AND DISPLAY MODULE WITH THE SAME

(71) Applicants: Yunnan Invensight Optoelectronics Technology Co., Ltd., Yunnan (CN); BOE Technology Group Co., Ltd., Beijing (CN)

(72) Inventors: Junbo Wei, Beijing (CN); Shengji Yang, Beijing (CN); Pengcheng Lu, Beijing (CN); Zhijian Zhu, Beijing (CN); Kuanta Huang, Beijing (CN); Yuanlan Tian, Beijing (CN)

(73) Assignees: YUNNAN INVENSIGHT OPTOELECTRONICS TECHNOLOGY CO., LTD., Yunnan (CN); BOE TECHNOLOGY GROUP CO., LTD., Beijing (CN)

( * ) Notice: Subject to any disclaimer, the term of this patent is extended or adjusted under 35 U.S.C. 154(b) by 643 days.

(21) Appl. No.: 17/505,482

(22) Filed: Oct. 19, 2021

(65) Prior Publication Data
US 2022/0302218 A1   Sep. 22, 2022

(30) Foreign Application Priority Data
Mar. 19, 2021   (CN) .......................... 202110297310.4

(51) Int. Cl.
*H10K 59/38*   (2023.01)
*H01L 23/488*   (2006.01)

(52) U.S. Cl.
CPC .......... *H10K 59/38* (2023.02); *H01L 23/488* (2013.01)

(58) Field of Classification Search
CPC ....................................................... H10K 59/38
USPC .......................................................... 257/40
See application file for complete search history.

(56) References Cited

U.S. PATENT DOCUMENTS

| | | | | |
|---|---|---|---|---|
| 2003/0047794 A1* | 3/2003 | Watanabe | ............... | H01L 24/03 257/459 |
| 2007/0126126 A1 | 6/2007 | Kim et al. | | |
| 2009/0225268 A1* | 9/2009 | Yokota | ................... | H05K 1/111 257/784 |
| 2013/0015592 A1* | 1/2013 | Kelkar | .................... | H01L 24/06 257/E23.068 |
| 2016/0056222 A1 | 2/2016 | Odaka et al. | | |
| 2018/0277029 A1 | 9/2018 | Lee et al. | | |

(Continued)

FOREIGN PATENT DOCUMENTS

| | | |
|---|---|---|
| CN | 1979835 A | 6/2007 |
| CN | 101533822 A | 9/2009 |

(Continued)

OTHER PUBLICATIONS

CN202110297310.4 first office action.

*Primary Examiner* — Ajay Arora
(74) *Attorney, Agent, or Firm* — IPro, PLLC

(57) ABSTRACT

The disclosure provides a chip and a display module with the same. The chip comprises a body, wherein the body is provided with a plurality of junctions which are arranged at intervals in a first direction, at least one junction comprises a first sub-junction and a second sub junction which are arranged in a second direction and formed into an integrated structure, a width of the first sub-junction is greater than a width of the second sub-junction in the first direction, and the second direction is perpendicular to the first direction.

17 Claims, 7 Drawing Sheets

(56) References Cited

U.S. PATENT DOCUMENTS

| | | | |
|---|---|---|---|
| 2020/0235019 A1* | 7/2020 | Miyaji | H01L 23/13 |
| 2022/0033532 A1* | 2/2022 | Waterson et al. | H05K 3/361 |
| | | | 257/E21.511 |
| 2022/0140053 A1* | 5/2022 | Pu | G09G 3/36 |
| | | | 257/40 |

FOREIGN PATENT DOCUMENTS

| | | |
|---|---|---|
| CN | 108628488 A | 10/2018 |
| CN | 111208684 A | 5/2020 |
| CN | 111916019 A | 11/2020 |
| CN | 112436050 A | 3/2021 |
| CN | 212694226 U | 3/2021 |

* cited by examiner

CHIP WITH PADS OF DIFFERING WIDTH AND DISPLAY MODULE WITH THE SAME

The present application claims the priority of the Chinese patent applications filed on Mar. 19, 2021 before the Chinese Patent Office with the application number of 202110297310.4 and the title of "CHIP AND DISPLAY MODULE WITH THE SAME", which are incorporated herein in their entirety by reference.

TECHNICAL FIELD

The disclosure relates to the technical field of display, in particular to a chip and a display module with the same.

BACKGROUND

In related arts, a chip of a display module is electrically connected with a circuit board. The reliability of the connection between the chip and the circuit board will affect the bonding yield of the display module. Therefore, how to improve the reliability of the connection between the chip and the circuit board is an important research direction.

SUMMARY

The disclosure provides a chip and a display module with the same.

A chip according to an embodiment of a first aspect of the disclosure comprises: a body, wherein the body is provided with a plurality of junctions which are arranged at intervals in a first direction, at least one junction comprises a first sub-junction and a second sub junction which are arranged in a second direction and formed into an integrated structure, a width of the first sub-junction is greater than a width of the second sub-junction in the first direction, and the second direction is perpendicular to the first direction.

In some embodiments, in the first direction, the first sub-junction and the second sub-junction of the junction are arranged coaxially.

In some embodiments, in the first direction, the first sub-junction and the second sub-junction of the junction are arranged non-coaxially.

In some embodiments, in the first direction, one end of the first sub-junction of the junction is flush with one end of the second sub-junction.

In some embodiments, any two adjacent said junctions are of a same structure or different structures.

In some embodiments, in the second direction, two ends of the plurality of the junctions are arranged in a flush manner.

In some embodiments, the plurality of the junctions protrude out of the body.

In some embodiments, the plurality of the junctions are recessed into the body.

In some embodiments, a part of the plurality of the junctions protrude out of the body, and other part of the plurality of the junctions are recessed into the body.

In some embodiments, at least two adjacent said junctions comprise the first sub-junction and the second sub-junction.

In some embodiments, two adjacent instances of the plurality of junctions comprise the first sub-junction and the second sub-junction, and in the first direction, the first sub-junction of one of the junctions is opposite to the second sub-junction of the adjacent junction, and the second sub-junction of one of the junctions is opposite to the first sub-junction of the adjacent junction.

In some embodiments, in the second direction, a length of the first sub-junction is less than or equal to a length of the corresponding second sub-junction.

In some embodiments, each of the junctions comprises the first sub-junction and the second sub-junction, the first sub-junction is configured for wire bonding connection with a hard circuit board, and the width of the first sub-junction is greater than a wire bonding width in the first direction.

In some embodiments, at least one of the first sub-junction and the second sub junction has a rectangle structure.

A display module according to an embodiment of a second aspect of the disclosure has an active area and comprises: the chip according to the embodiment of the first aspect of the disclosure, wherein the chip has a first area and a second area spaced apart from each other, the first area is arranged corresponding to the active area, the junctions are arranged in the second area, and the junctions are configured to be formed as signal interfaces.

In some embodiments, the display module further comprises: a silicon substrate and a cover plate which are oppositely arranged in a third direction; an organic light-emitting device arranged between the silicon substrate and the cover plate and comprising a pixel driving circuit layer, an anode layer, an organic light-emitting layer and a cathode layer, the pixel driving circuit layer, the anode layer, the organic light-emitting layer and the cathode layer being sequentially stacked in the third direction, and the pixel driving circuit layer being arranged on a side surface, facing the cover plate, of the silicon substrate; and a color film layer arranged between the cover plate and the organic light-emitting device, packaging layers being arranged between the color film layer and the cover plate and between the color film layer and the organic light-emitting device.

Additional aspects and advantages of the disclosure will be set forth in part in the description that follows, and in part will be obvious from the description that follows, or may be learned by practice of the disclosure.

BRIEF DESCRIPTION OF THE DRAWINGS

The above and/or additional aspects and advantages of the disclosure will become apparent and easily understood from the description of embodiments taken in conjunction with the following drawings, in which.

DETAILED DESCRIPTION

Figure 1:
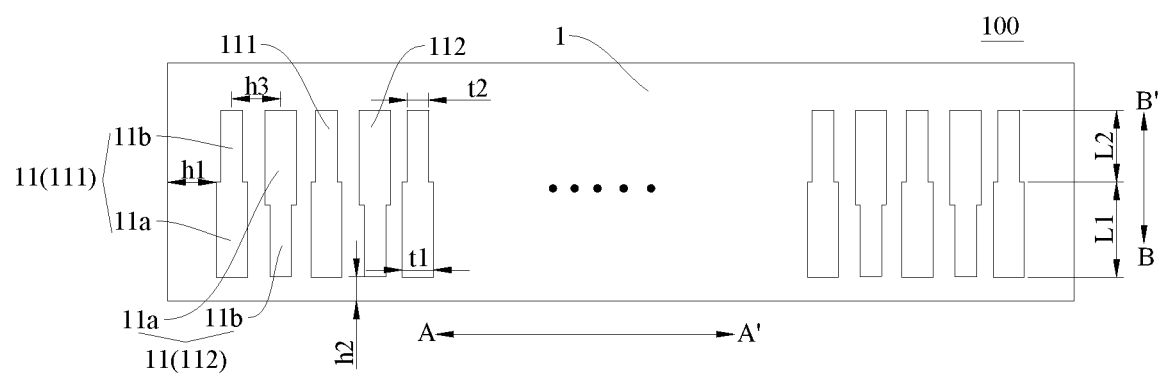
FIG. 1 is a diagram of a chip according to an embodiment of the disclosure.

Embodiments of the disclosure are described in detail below, examples of which are shown in the accompanying drawings, in which identical or similar reference numerals denote identical or similar elements or elements having identical or similar functions throughout. The embodiments described below with reference to the drawings are exemplary and are intended to explain the disclosure, but cannot be understood as limiting the disclosure.

The following provides many different embodiments or examples for implementing different structures of the disclosure. In order to simplify the disclosure, components and arrangements of specific examples are described below. Of course, they are only examples and are not intended to limit the disclosure. In addition, the disclosure may repeat reference numerals and/or letters in different examples, and such repetition is for the sake of simplicity and clarity, and does not itself indicate the relationship between the various embodiments and/or arrangements discussed. In addition, the disclosure provides examples of various specific processes and materials, but those of ordinary skill in the art may realize the application of other processes and/or the use of other materials.

Next, a chip 100 (or named DIE) according to an embodiment of a first aspect of the disclosure will be described with reference to the drawings.

Figure 2:
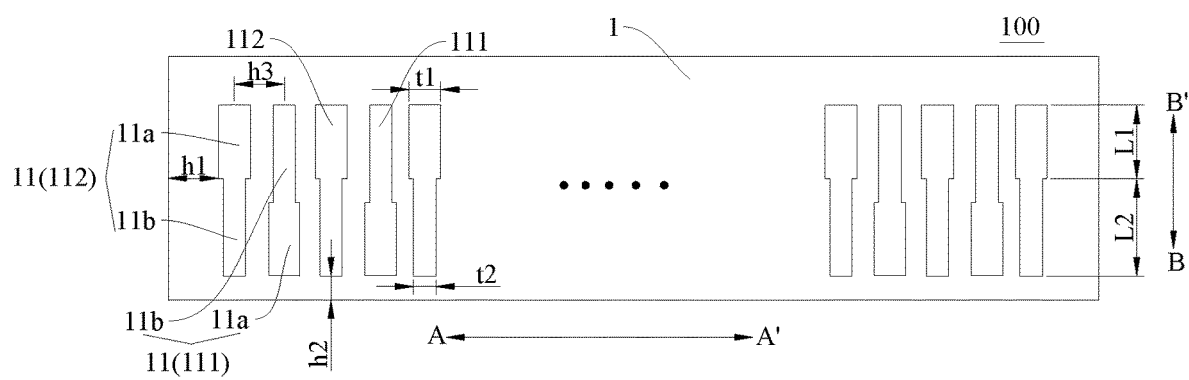
FIG. 2 is a diagram of a chip according to another embodiment of the disclosure.
Figure 3:
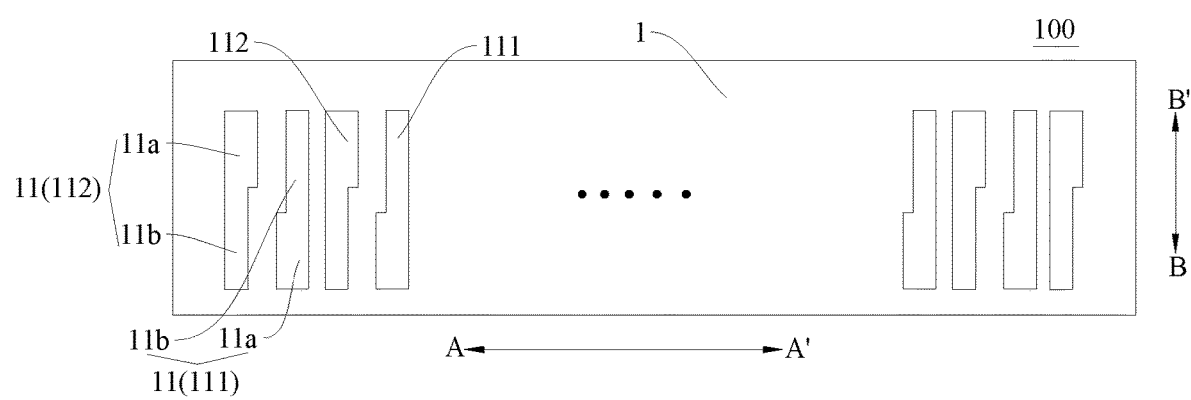
FIG. 3 is a diagram of a chip according to yet another embodiment of the disclosure.

As shown in FIGS. 1-3, the chip 100 comprises a body 1 with a plurality of junctions 11 (or named PAD), and the plurality of junctions 11 may be used for electric connection with other components such as circuit boards, so as to realize the bonding connection of the chip 100.

As shown in FIGS. 1-3, the plurality of junctions 11 may be arranged at intervals in a first direction (e.g., AA' direction in FIG. 1), and at least one junction 11 comprises a first sub-junction 11a and a second sub-junction 11b, the first sub-junction 11a and the corresponding second sub-junction 11b are arranged in a second direction (e.g., BB' direction in FIG. 1) and formed into an integrated structure, and the second direction is perpendicular to the first direction. In the first direction, the width of the first sub-junction 11a is greater than that of the second sub-junction 11b, which is conducive to increasing the area of the first sub-junction 11a under the condition that the junctions 11 have the same length and the distances between two adjacent junctions 11 are the same, so that the area of the junctions 11 can be increased; as a result, the bonding connection area of the chip 100 can be increased when the bonding connection of the chip 100 is realized, the reliability of electric connection of the chip 100 is improved, and the bonding yield of the chip 100 is improved. Therefore, when the chip 100 is applied to a display module 200, the electrical adhesion between the chip 100 and a PCB module (such as a hard circuit board 106 described later) or an FPC module (such as a flexible circuit board 107 described later) can be improved.

Therefore, in this application, the chip 100 is well compatible with the PCB module and FPC module, so that the chip 100 is capable of matching optical-mechanical module structures when applied to the display module 200, uniformity is good, and thus user experience is improved. Furthermore, due to the large area of the junctions 11, when the chip 100 is connected with the PCB module, the wire bonding requirement can be met, such as the wire bonding width requirement, and when the chip 100 is connected with the FPC module, a large contact area between the chip 100 and the FPC module may be ensured, thereby improving the bonding yield and bonding reliability of the display module 200; as a result, the bonding machine compatibility of the display module 200 is met, the product yield and display effect of the display module 200 are improved, the display uniformity of the display module 100 is improved, and the service life of the display module 200 is prolonged.

It may be understood that the number of the junctions 11 comprising the first sub junctions 11a and the second sub-junctions 11b may be less than or equal to the number of all the junctions 11. When the number of the junctions 11 comprising the first sub junctions 11a and the second sub junctions 11b is less than the number of all the junctions 11, for part of the junctions 11, each junction 11 is configured to comprise the first sub-junction 11a and the second sub-junction 11b, and for the rest part, each junction 11 is not configured to comprise the first sub-junction 11a and the second sub-junction 11b. When the number of the junctions 11 comprising the first sub-junctions 11a and the second sub-junctions 11b is equal to the number of all the junctions 11, for all the junctions 11, each junction 11 is configured to comprise the first sub-junction 11a and the second sub-junction 11b.

According to the chip 100 of the embodiment of the disclosure, by making at least one junction 11 comprise the first sub-junction 11a and the second sub-junction 11b, the chip is compatible with the PCB module and the FPC module, the bonding strength and electric connection reliability between the chip 100 and the PCB module is ensured, the contact area between the chip 100 and the FPC module is ensured, the electrical adhesion between the chip 100 and other components is improved, and the reliability of electric connection of the chip 100 is improved; as a result, when the chip 100 is applied to the display module 200, the bonding yield and display effect of the display module 200 are improved. Besides, the chip is simple in structure, easy to implement, and low in cost. Compared with the situation where the junctions are of a rectangular structure, this application allows the area of the junctions 11 to be increased on the premise of ensuring the distance between adjacent junctions 11.

In some embodiments, as shown in FIGS. 1 and 2, the first sub-junction 11a and the second sub-junction 11b of the junction 11 are coaxially arranged in the first direction, that is, the central axes of the first sub-junction 11a and the second sub-junction 11b of the same junction 11 coincide, wherein the central axes of the first sub-junction 11a and the second sub-junction 11b both extend in the second direction. Since the width of the first sub junction 11a in the first direction is greater than that of the corresponding second sub-junction 11b, two ends of the first sub-junction 11a in the first direction respectively extend beyond the two corresponding ends of the second sub-junction 11b. Therefore, the junctions 11 are of a regular structure and are easy to process.

In other embodiments, as shown in FIG. 3, in the first direction, the first sub-junction 11a and the second sub-junction 11b of the junction 11 are arranged non-coaxially, that is, the central axes of the first sub-junction 11a and the second sub-junction 11b of the same junction 11 are arranged in parallel. Therefore, the positions of the first sub-junction 11a and the corresponding second sub-junction 11b are flexible, which facilitates the diversified structural design of the chip 100 and is conducive to improving the applicability of the chip 100.

In some embodiments, as shown in FIG. 3, in the first direction, the first sub junction 11a and the second sub-junction 11b of the junction 11 are arranged non-coaxially, and one end of the first sub-junction 11a is flush with one end of the second sub-junction 11b. In this case, the other end of the first sub-junction 11a in the first direction extends beyond the other end of the corresponding second sub-junction 11b in the first direction, allowing more diversified structural design of the chip 100.

In some embodiments, the structures of any two adjacent junctions 11 are the same (as shown in FIGS. 1-3) or different, allowing more diversified structural design of the chip 100. It may be understood that at least one of any two adjacent junctions 11 comprises the first sub-junction 11a and the second sub-junction 11b, the structures of the two adjacent junctions 11 may be different when one of the two adjacent junctions 11 comprises the first sub-junction 11a and the second sub-junction 11b, and the structures of the two adjacent junctions 11 may be the same or different when the two adjacent junctions 11 each comprise the first sub-junction 11a and the second sub-junction 11b.

It should be noted that the structures of two adjacent junctions 11 being the same means that the shapes and dimensions (such as length, width, height, angle, etc.) at any corresponding positions of the two adjacent junctions 11 are the same. The structures of two adjacent junctions 11 being different means that the shapes and/or dimensions of at least one corresponding position of the two adjacent junctions 11 are different.

In some embodiments, as shown in FIGS. 1-3, in the second direction, two ends of the plurality of junctions 11 are arranged in a flush manner, that is, one ends of the plurality of junctions 11 are arranged in a flush manner and the other ends of the plurality of junctions 11 are arranged in a flush manner in the second direction. In this case, the plurality of junctions 11 can be arranged into a line on the body 1, so that the junctions 11 are arranged regularly, facilitating the electric connection between the chip 100 and other components.

For example, in the examples of FIGS. 1-3, two end edges of each junction 11 in the second direction may be respectively formed as straight edges extending in the first direction, straight edges corresponding to one ends of all the junctions 11 in the second direction are located on a same straight line, and straight edges corresponding to the other ends of all the junctions 11 in the second direction are located on a same straight line.

Of course, in the second direction, two ends of the plurality of junctions 11 may also be arranged in a non-flush manner, and in this case, the ends of at least one of all the junctions 11 are not flush with the ends of other junctions 11, which is conductive to improving the structural flexibility of the chip 100.

In some embodiments, as shown in FIGS. 1-3, at least one of the first sub-junction 11a and the second sub-junction 11b is of a rectangle structure, that is, the first sub-junction 11a is of a quadrate structure and the second sub-junction 11b is not of a quadrate structure, or the second sub-junction 11b is of a quadrate structure and the first sub-junction 11a is not of a quadrate structure, or the first sub-junction 11a and the second sub-junction 11b are both of a quadrate structure. Therefore, the first sub-junction 11a and/or the second sub-junction 11b are simple in structure and easy to manufacture, and a sufficient area of the first sub-junction 11a and/or the second sub-junction 11b is easily ensured, so as to ensure the bonding yield.

It should be noted that "rectangle structure" may be understood as a parallelogram structure with all inner corners at right angles, and at least one of the first sub-junction 11a and the second sub-junction 11b is of a square structure, or at least one of the first sub-junction 11a and the second sub-junction 11b is of a rectangular structure.

Of course, the shape of the first sub-junction 11a and the second sub-junction 11b is not limited to this, for example, the first sub-junction 11a and the second sub-junction 11b may also be of other polygonal structures.

In some embodiments, all the junctions 11 protrude out of the body 1, that is, the junctions 11 may be formed as convex structures on a surface of the body 1, which facilitates the manufacturing of all the junctions 11, and allows operators to effectively identify the positions of the junctions 11, thus improving the connection efficiency of the chip 100.

In other embodiments, all the junctions 11 are recessed into the body 1, that is, the junctions 11 may be formed as concave structures on the surface of the body 1, which facilitates the manufacturing of all the junctions 11, and also allows operators to effectively identify the positions of the junctions 11, thus improving the connection efficiency of the chip 100.

In some other embodiments, some of all the junctions 11 protrude out of the body 1, and the rest of all the junctions 11 is recessed into the body 1, which also allows operators to effectively identify the positions of the junctions 11.

In some embodiments, as shown in FIGS. 1-3, at least two adjacent junctions 11 each comprise the first sub-junction 11a and the second sub-junction 11b. When two of the plurality of junctions 11 each comprise the first sub-junction 11a and the second sub-junction 11b, the two junctions 11 are arranged adjacent to each other, that is, no other junctions 11 are arranged between the two junctions 11. When three of the plurality of junctions 11 each comprise the first sub-junction 11a and the second sub-junction 11b, at least two of the three junctions 11 are arranged adjacently, that is, the three junctions 11 are arranged adjacently or two of the three junctions 11 are arranged adjacently and at least one junction 11 other than the three junctions 11 is arranged between the other one of the three junctions and the two adjacent junctions. When four or more of the plurality of junctions 11 each comprise the first sub-junction 11a and the second sub-junction 11b, at least two of the four junctions 11 are arranged adjacent to each other. Therefore, on the premise of ensuring a distance between two adjacent junctions 11, the distance between two adjacent junctions 11 may be effectively used to increase the area of the junctions 11, thereby ensuring the bonding yield.

In some embodiments, as shown in FIGS. 1-3, two adjacent ones of the plurality of junctions 11 each comprise the first sub-junction 11a and the second sub-junction 11b, and in the first direction, the first sub-junction 11a of one junction 11 is opposite to the second sub junction 11b of the adjacent junction 11 and the second sub-junction 11b of one junction 11 is opposite to the first sub-junction 11a of the adjacent junction 11, so that the first sub-junction 11a of the junction 11 and the first sub-junction 11a of the adjacent junction 11 are staggered in the first direction and the second sub-junction 11b of the junction 11 and the second sub-junction 11b of the adjacent junction 11 are staggered in the first direction. Therefore, on the premise of ensuring the distance between two adjacent junctions 11, the distance between two adjacent junctions 11 may be further effectively used to increase the area of the junctions 11.

For example, in the example of FIG. 1, the BB' direction is taken as the up-and-down direction, the first two junctions 11 on the left side in FIG. 1 are taken as the two adjacent junctions 11, the first sub-junction 11a of one junction 11 is located below the corresponding second sub-junction 11b (for example, the first junction 11 on the left side in FIG. 1), and the first sub-junction 11a of the other junction 11 is located above the corresponding second sub-junction 11b (for example, the second junction 11 on the left side in FIG. 1), so that the first sub-junction 11a of one junction 11 and the second sub-junction 11b of the other junction 11 are opposite to each other in the first direction, and the second sub-junction 11*b* of one junction 11 and the first sub-junction 11*a* of the other junction 11 are opposite to each other in the first direction. In other words, the arrangement of the first sub-junctions 11*a* and the second sub junctions 11*b* of two adjacent junctions 11 in the second direction is just opposite.

In some embodiments, as shown in FIGS. 2 and 3, the length of the first sub junction 11*a* is less than or equal to half of the sum of the lengths of the first sub-junction 11*a* and the corresponding second sub-junction 11*b* in the second direction, that is, the length of the first sub-junction 11*a* may be smaller than that of the corresponding second sub-junction 11*b*, so that when the first sub-junction 11*a* and the adjacent second sub-junction 11*b* are oppositely arranged in the first direction, on the premise of ensuring the distance between two adjacent junctions 11, the width of the first sub-junction 11*a* may be further appropriately increased, so that the area of the first sub-junctions 11*a* is further increased.

For example, in the example of FIG. 2, in the second direction, the length of the first sub-junction 11*a* is L1 and the length of the second sub-junction 11*b* corresponding to the first sub-junction 11*a* is L2, then L1<(L1+L2)/2 or L1<L2. Of course, as shown in FIG. 1, in the second direction, the length L1 of the first sub-junction 11*a* may also be greater than the length L2 of the corresponding second sub-junction 11*b*.

In the examples of FIG. 1 and FIG. 2, 104 junctions 11 are provided, the length of the body 1 in the first direction is 1248 mm, mark areas are reserved on both sides of the body 1 in the first direction, the width h1 of the mark areas is 500 µm, a distance h2 between lower ends of the junctions 11 and an edge of the body 1 is 110 µm, a distance h3 between two adjacent junctions 11 in the first direction is 110 µm, the width t1 of the first sub-junction 11*a* in the first direction is 70 µm, the width t2 of the second sub-junction 11*b* in the first direction is 50 µm, and the area S of the junctions 11 is L1*t1+L2*t2. In FIG. 1, the length L1 of the first sub-junction 11*a* in the second direction is 400 µm, and the length L2 of the second sub-junction 11*b* in the second direction is 300 µm. In FIG. 2, the length L1 of the first sub-junction 11*a* in the second direction is 300 µm, and the length L2 of the second sub-junction 11*b* in the second direction is 400 µm.

Under the same conditions, the junctions are arranged into a rectangular structure as a whole, the width of the junction in the first direction is 70 µm, and 95 junctions can be arranged. When the number of signal transmissions is large, this arrangement cannot meet the requirement for testing output signals. Therefore, in this application, by making the first sub-junction 11*a* of the junction 11 opposite to the second sub-junction 11*b* of the adjacent junction 11, the second sub-junction 11*b* of the junction 11 opposite to the first sub-junction 11*a* of the adjacent junction 11, and the length of the first sub-junction 11*a* smaller than the length of the corresponding second sub-junction 11*b*, it is possible to effectively use the distance between two adjacent junctions under the same conditions (the same body size, the same distance between adjacent junctions in the first direction, etc.) to arrange more junctions 11, so as to increase the number of test signals, monitoring signals and other signals, thus meeting the transmission requirement when the number of signal transmissions is large, monitoring and testing the internal signals and functions of a panel of the display module 200, and improving the display effect, tolerance and applicability of the display module 200.

It may be understood that when two adjacent junctions 11 each comprise the first sub-junction 11*a* and the second sub-junction 11*b* and the structures of the two adjacent junctions 11 are the same, the lengths of the first sub junctions 11*a* of the two junctions 11 are equal, and the lengths of the second sub junctions 11*b* of the two junctions 11 are also equal. When two adjacent junctions 11 each comprise the first sub-junction 11*a* and the second sub-junction 11*b* and the structures of the two adjacent junctions 11 are different, the lengths of the first sub-junctions 11*a* of the two junctions 11 may be different, and/or the lengths of the second sub junctions 11*b* of the two junctions 11 may be different.

Figure 4:
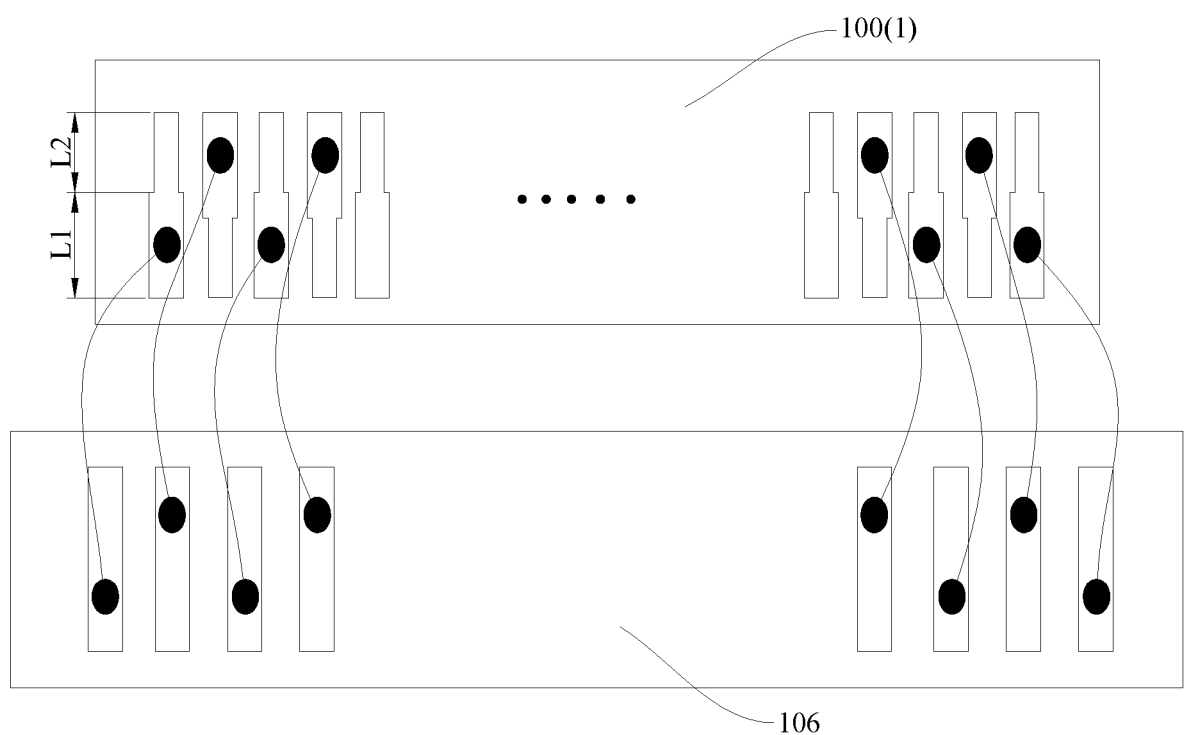
FIG. 4 is a diagram of connection between a chip and a hard circuit board according to an embodiment of the disclosure.

In some embodiments, as shown in FIG. 4, each junction 11 comprises the first sub-junction 11*a* and the second sub-junction 11*b*, and the first sub-junction 11*a* is suitable for wire bonding connection with a hard circuit board 106; for example, the first sub-junction 11*a* may be electrically connected with the hard circuit board 106 through an aluminum wire. Since the first sub-junction 11*a* is quite wide, the reliable connection between the chip 100 and the hard circuit board 106 is easily ensured. In the first direction, the width of the first sub-junction 11*a* is greater than a wire bonding width, so that the width requirement of the aluminum wire may be met, the tension requirement of wire bonding may be ensured, and the wire bonding yield and reliability may be improved.

For example, in the example of FIG. 4, the width t1 of the first sub-junction 11*a* in the first direction is 70 µm, the wire bonding width is 45 µm, and an error of wire bonding equipment is ±5 µm, then the width of the first sub-junction 11*a* may match the error of the wire bonding equipment, meet an offset error of wire bonding, and meet the width requirement of wire bonding, thereby ensuring the tension requirement of wire bonding, improving the wire bonding yield and reliability, and ensuring reliable connection between the chip 100 and gold fingers on the hard circuit board 106.

Figure 5:
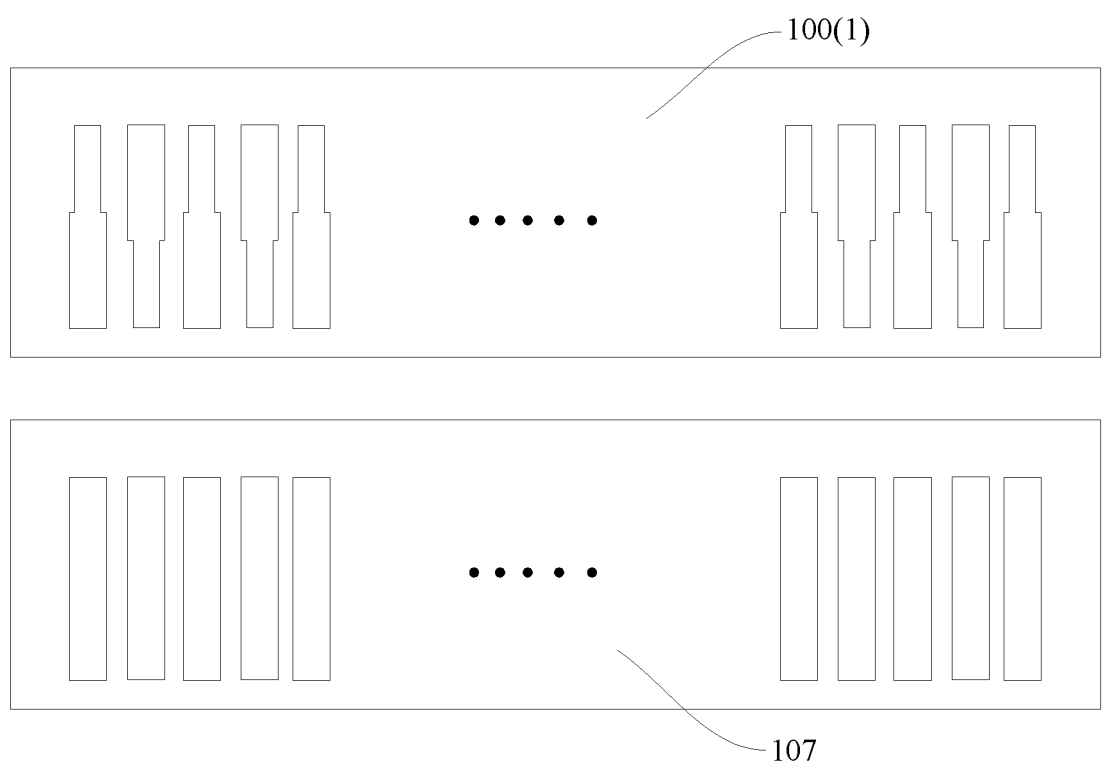
FIG. 5 is a diagram of connection between a chip and a flexible circuit board according to an embodiment of the disclosure.

For example, as shown in FIG. 5, the flexible circuit board 107 also has gold fingers, and the chip 100 may also be electrically connected with the gold fingers of the flexible circuit board 107. In this case, the whole junctions 11 may make contact with the gold fingers of the flexible circuit board 107 through an ACF adhesive (anisotropic conductive adhesive), thus ensuring a large contact area between the chip 100 and the gold fingers, ensuring the number of conductive particles of the ACF adhesive, improving the conductivity and contact impedance between the chip 100 and the flexible circuit board 107, and ensuring reliable connection between the chip 100 and the flexible circuit board 107.

Therefore, in this application, the chip 100 is well compatible with both the hard circuit board 106 and the flexible circuit board 107, so that the chip 100 is capable of matching optical-mechanical module structures when applied to the display module 200 (such as an AR/VR head-mounted display device or a near-eye display device), uniformity is good, and thus user experience is improved.

Figure 6:
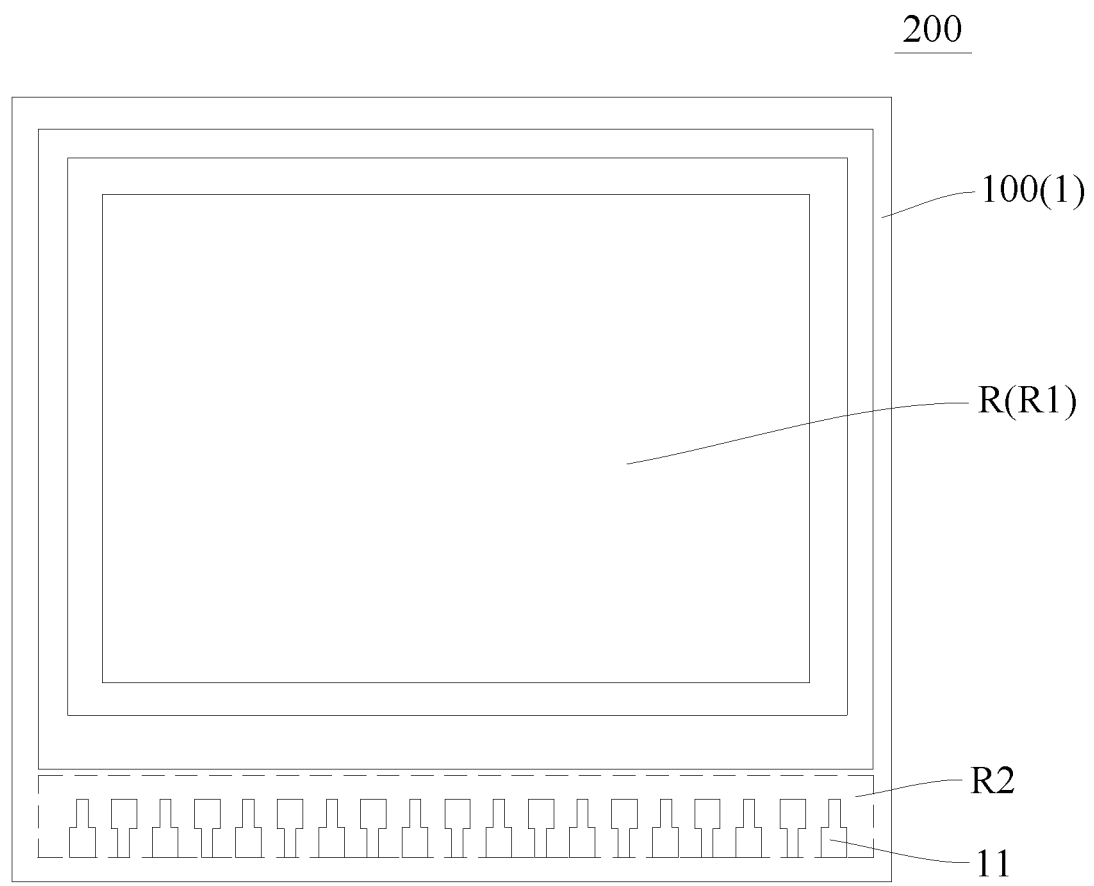
FIG. 6 is a diagram of a display module according to an embodiment of the disclosure.

The display module 200 according to an embodiment of a second aspect of the disclosure, as shown in FIG. 6, has an active area R and comprises the chip 100 according to the embodiment of the first aspect of the disclosure. The chip 100 has a first area R1 and a second area R2 spaced apart from each other, the first area R1 is arranged corresponding to the active area R, and junctions 11 are arranged in the second area R2 and preferably formed as signal interfaces. For example, the junctions 11 can realize the connection between external electrical signals (such as external power signals) and an internal circuit of the display module 100. In this case, the junctions 11 can be understood as a connection channel between the external electrical signals and the internal circuit, and an input interface for signals such as external power signals.

Therefore, according to the display module 200 of the embodiment of the disclosure, the bonding yield and display effect of the display module 200 may be improved by adopting the chip 100 described above.

Figure 7:
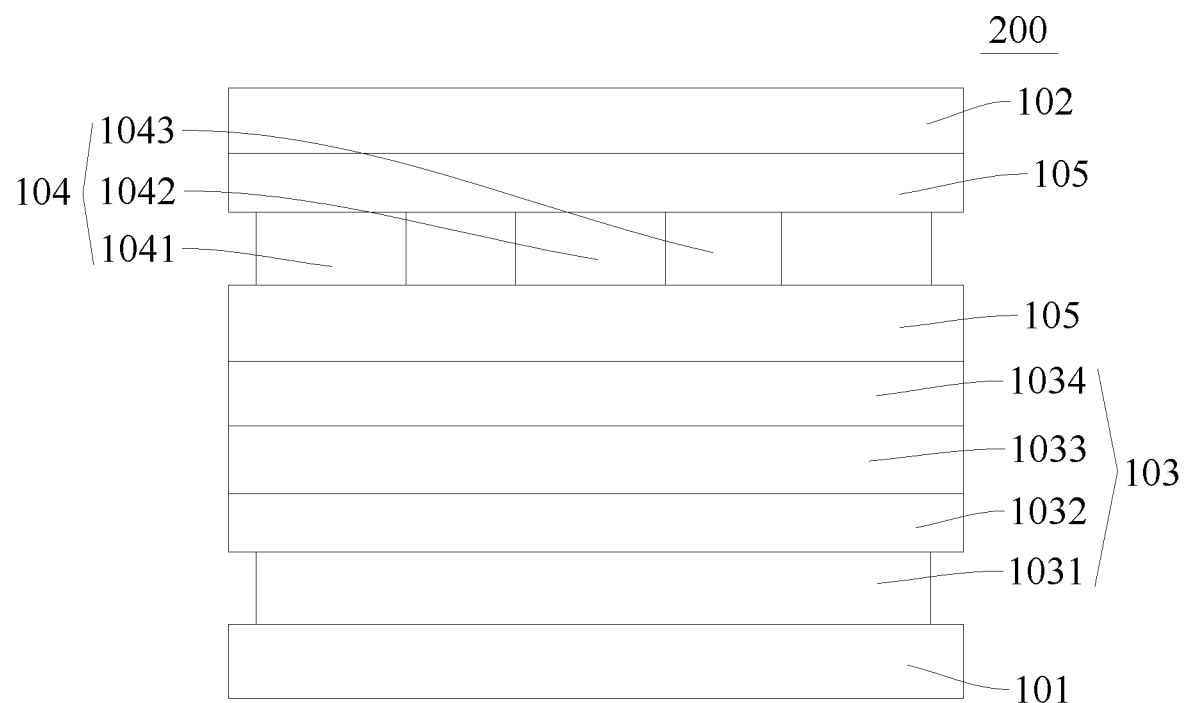
FIG. 7 is another diagram of the display module shown in FIG. 6.

In some embodiments, as shown in FIG. 7, the display module 200 further comprises a silicon substrate 101, a cover plate 102, an organic light-emitting device 103 and a color film layer 104, wherein the silicon substrate 101 and the cover plate 102 are oppositely arranged in a third direction (for example, CC' direction in FIG. 7), the organic light-emitting device 103 is arranged between the silicon substrate 101 and the cover plate 102, the organic light-emitting device 103 comprises a pixel driving circuit layer 1031, an anode layer 1032, an organic light-emitting layer 1033 and a cathode layer 1034 which are sequentially stacked in the third direction, and the pixel driving circuit layer 1031 is arranged on a side surface, facing the cover plate 102, of the silicon substrate 101. The color film layer 104 is arranged between the cover plate 102 and the organic light-emitting device 103, and packaging layers 105 are arranged between the color film layer 104 and the cover plate 102 and between the color film layer and the organic light-emitting device 103 respectively, that is, the packaging layers 105 are arranged between the color film layer 104 and the cover plate 102, and the packaging layers 105 are arranged between the color film layer 104 and the organic light-emitting device 103, so as to realize the effective packaging of the color film layer 104, prevent against the intrusion of water vapor, oxygen and the like as a protector, and prolong the service life of the display module 200. Besides, the cover plate 102 may also protect the color film layer 104.

For example, in the example of FIG. 7, the cover plate 102 is a transparent member, for example, the cover plate 102 is a high-transmittance mother glass member; the pixel driving circuit layer 1031 is fabricated on the silicon substrate 101 by a CMOS process; the anode layer 1032 may be made of ITO (indium tin oxide), so that the anode layer 1032 has high transmittance and a high work function; the organic light-emitting layer 1033 may be made of an organic material, so that the light-emitting characteristics of the organic material may be utilized to realize light emission after the organic light-emitting layer 1033 is electrified; the cathode layer 1034 may be a metal layer, and the cathode layer 1034 may be made of magnesium or silver alloy; and the color film layer 104 comprises a plurality of pixel units, each of which comprises a first sub-pixel 1041, a second sub-pixel 1042 and a third sub-pixel 1043, wherein the first sub-pixel 1041 is a red sub-pixel, the second sub-pixel 1042 is a green sub-pixel, and the third sub-pixel 1043 is a blue sub-pixel. The color film layer 104 is matched with the organic light-emitting layer 1033 to realize color display of emitted light.

The packaging layer 105 may be made of one or a combination of organic materials and inorganic materials with good sealing characteristics, so as to protect the color film layer 104 and achieve a good sealing effect.

Optionally, the display module 200 may be a micro-OLED display module, and the organic light-emitting device 103 may be an organic light-emitting diode device. An OLED display module based on the silicon substrate 101 has the characteristics of small size and high resolution, and may be manufactured by an integrated circuit CMOS process to realize the active addressing of pixels. The OLED display module has various circuits such as TCON and OCP, which is conductive to realizing light weight, and may be applied in the fields of near-eye display, virtual reality, augmented reality, etc., especially in an AR/VR head-mounted display device.

Other components and operations of the display module 200 according to embodiments of the disclosure are known to those of ordinary skill in the art, and will not be described in detail here.

The chip 100 according to an embodiment of the disclosure will be described in detail in two specific embodiments with reference to FIGS. 1 and 2. It is to be understood that the following description is only an exemplary illustration, not a specific limitation on the invention.

In this embodiment, as shown in FIG. 1, the chip 100 comprises a body 1, wherein the body 1 is provided with a plurality of junctions 11 which are arranged at intervals in direction AA', each junction 11 comprises a first sub-junction 11a and a second sub-junction 11b which are both of a rectangular structure, the first sub-junction 11a and the second sub-junction 11b are arranged in direction BB' and formed into an integrated structure, and the width of the first sub-junction 11a is greater than that of the second sub-junction 11b in direction AA'.

Any two adjacent junctions 11 are of the same structure, and in the first direction, two ends of all the junctions 11 are arranged in a flush manner. The first sub-junction 11a of the junction 11 and the corresponding second sub-junction 11b are coaxially arranged, and a central axis of the first sub-junction 11a extending in the direction BB' coincides with that of the second sub-junction 11b extending in the direction BB'.

As shown in FIG. 1, the plurality of junctions 11 comprise a plurality of first junctions 111 and a plurality of second junctions 112, and the plurality of first junctions 111 and the plurality of second junctions 112 are staggered in the direction AA', so that a second junction 112 is arranged between two adjacent first junctions 111 and a first junction 111 is arranged between two adjacent second junctions 112. The first sub-junction 11a of the first junction 111 and the second sub-junction 11b of the adjacent second junction 112 are opposite to each other in the direction AA', and the second sub-junction 11b of the first junction 111 and the first sub-junction 11a of the adjacent second junction 112 are opposite to each other in the direction AA'. The structure of the first junction 111 is the same as that of the second junction 112.

As shown in FIG. 1, in the direction BB', the length L1 of the first sub-junction 11a is greater than the length L2 of the corresponding second sub-junction 11b.

As shown in FIG. 2, the structure of this embodiment is substantially the same as that of the above embodiment. The same components are given the same reference numerals. The difference is that the length L1 of the first sub-junction 11a is smaller than the length L2 of the corresponding second sub-junction 11b in the direction BB'.

In the description of the disclosure, it should be noted that the orientation or position relationship indicated by the terms "center", "longitudinal", "transverse", "length", "width", "thickness", "upper", "lower", "front", "rear", "left", "right", "vertical", "horizontal", "top", "bottom", "inner", "outer", "axial", "radial" and "peripheral" are based on the orientation or position relationship shown in the drawings, only for convenience of describing the disclosure and simplifying the description, and do not indicate or imply that the device or element referred to must have a specific orientation, or be constructed and operated in a specific orientation, and therefore cannot be understood as a limitation of the disclosure. In addition, the features defined with "first" and "second" may explicitly or implicitly include one or more of the features. In the description of the disclosure, unless otherwise specified, "a plurality of" refers to two or more.

In the description of the disclosure, it should be also noted that the terms "install" and "connect" should be understood in a broad sense unless otherwise specified and defined. For example, it can be fixed connection, detachable connection or integrated connection; it can be mechanical connection or electric connection; and it can be direct connection, indirect connection through intermediate media or internal communication of two elements. For those of ordinary skill in the art, the specific meaning of the above terms in the disclosure can be understood in specific situations.

In the description of this specification, descriptions with reference to the terms "one embodiment", "some embodiments", "schematic embodiments", "examples", "specific examples" or "some examples" mean that specific features, structures, materials or characteristics described in connection with this embodiment or example are included in at least one embodiment or example of this disclosure. In this specification, the schematic expression of the above terms does not necessarily refer to the same embodiment or example. Furthermore, the specific features, structures, materials or characteristics described may be combined in any one or more embodiments or examples in a suitable manner.

Although the embodiments of the disclosure have been shown and described, it will be understood by those of ordinary skill in the art that various changes, modifications, substitutions and variations can be made to these embodiments without departing from the principles and spirit of the disclosure, the scope of which is defined by the claims and their equivalents.

The invention claimed is:

1. A chip, comprising:
a body, wherein the body is provided with a plurality of junctions which are arranged at intervals in a first direction, at least one said junction comprises a first sub-junction and a second sub-junction which are arranged in a second direction and formed into an integrated structure, a width of the first sub-junction is greater than a width of the second sub-junction in the first direction, the second direction is perpendicular to the first direction,
wherein at least two adjacent said junctions comprise the first sub-junction and the second sub-junction, and
wherein two adjacent instances of the plurality of junctions comprise the first sub-junction and the second sub-junction, and in the first direction, the first sub-junction of one of the junctions is opposite to the second sub-junction of the adjacent junction, and the second sub-junction of one of the junctions is opposite to the first sub-junction of the adjacent junction.

2. The chip according to claim 1, wherein in the first direction, the first sub junction and the second sub-junction of the junction are arranged coaxially.

3. The chip according to claim 1, wherein in the first direction, the first sub junction and the second sub-junction of the junction are arranged non-coaxially.

4. The chip according to claim 3, wherein in the first direction, one end of the first sub-junction of the junction is flush with one end of the second sub-junction.

5. The chip according to claim 1, wherein any two adjacent said junctions are of a same structure or different structures.

6. The chip according to claim 1, wherein in the second direction, two ends of plurality of junctions are arranged in a flush manner.

7. The chip according to claim 1, wherein in the second direction, a length of the first sub-junction is less than or equal to a length of the corresponding second sub-junction.

8. A chip, comprising:
a body, wherein the body is provided with a plurality of junctions which are arranged at intervals in a first direction, at least one said junction comprises a first sub-junction and a second sub-junction which are arranged in a second direction and formed into an integrated structure, a width of the first sub-junction is greater than a width of the second sub-junction in the first direction, the second direction is perpendicular to the first direction,
wherein each of the junctions comprises the first sub-junction and the second sub-junction, the first sub-junction is configured for wire bonding connection with a hard circuit board, and the width of the first sub-junction is greater than a wire bonding width in the first direction.

9. The chip according to claim 1, wherein at least one of the first sub-junction and the second sub-junction has a rectangle structure.

10. A display module having an active area, comprising:
a chip including a body, wherein the body is provided with a plurality of junctions which are arranged at intervals in a first direction, at least one said junction comprises a first sub-junction and a second sub-junction which are arranged in a second direction and formed into an integrated structure, a width of the first sub-junction is greater than a width of the second sub-junction in the first direction, the second direction is perpendicular to the first direction,
wherein the chip has a first area and a second area spaced apart from each other, the first area is arranged correspondingly to the active area, the junctions are arranged in the second area, and the junctions are configured to be formed as signal interfaces.

11. The display module according to claim 10, further comprising:
a silicon substrate and a cover plate which are oppositely arranged in a third direction;
an organic light-emitting device arranged between the silicon substrate and the cover plate and comprising a pixel driving circuit layer, an anode layer, an organic light-emitting layer and a cathode layer, the pixel driving circuit layer, the anode layer, the organic light-emitting layer and the cathode layer being sequentially stacked in the third direction, and the pixel driving circuit layer being arranged on a side surface, facing the cover plate, of the silicon substrate; and
a color film layer arranged between the cover plate and the organic light-emitting device, packaging layers being arranged between the color film layer and the cover plate and between the color film layer and the organic light-emitting device.

12. The chip according to claim 1, wherein, in the second direction, a length of the first sub-junction is greater than a length of the corresponding second sub-junction.

13. The chip according to claim 1, wherein a distance between the two adjacent junctions in the first direction is 110 m, a width of the first sub-junction in the first direction is 70 μm, and a width of the second sub-junction in the first direction is 50 μm.

14. The chip according to claim 12, wherein the length of the first sub-junction in the second direction is 400 μm, and the length of the second sub-junction in the second direction is 300 μm.

15. The chip according to claim 1, wherein in the second direction, a length of the first sub-junction is less than a length of the corresponding second sub-junction, the length of the first sub-junction in the second direction is 300 μm, and the length of the second sub-junction in the second direction is 400 μm.

16. The chip according to claim 1, wherein mark areas are reserved on both sides of the body in the first direction, a width of the mark areas is 500 μm, and a distance between one end of the junctions and an edge of the body is 110 μm.

17. The chip according to claim 1, wherein a portion of the plurality of junctions protrude out of the body and other portion of the plurality of junctions are recessed into the body to help an operator to identify positions of the plurality of junctions.

\* \* \* \* \*